(12) United States Patent
Stroyer (10) Patent No.: US 12,211,662 B2
(45) Date of Patent: Jan. 28, 2025

(54) CIRCUIT BREAKER TRIP DEVICE

(71) Applicant: Benjamin G. Stroyer, East Rochester, NY (US)

(72) Inventor: Benjamin G. Stroyer, East Rochester, NY (US)

( * ) Notice: Subject to any disclaimer, the term of this patent is extended or adjusted under 35 U.S.C. 154(b) by 0 days.

(21) Appl. No.: 17/954,943

(22) Filed: Sep. 28, 2022

(65) Prior Publication Data

US 2023/0129683 A1    Apr. 27, 2023

Related U.S. Application Data

(60) Provisional application No. 63/271,131, filed on Oct. 23, 2021.

(51) Int. Cl.
*H01H 71/04*    (2006.01)
*H01H 71/12*    (2006.01)
*H01H 79/00*    (2006.01)

(52) U.S. Cl.
CPC .......... *H01H 71/128* (2013.01); *H01H 71/04* (2013.01); *H01H 79/00* (2013.01)

(58) Field of Classification Search
CPC ...... H01H 79/00; H01H 71/128; H01H 71/04; G01R 31/3277
See application file for complete search history.

(56) References Cited

U.S. PATENT DOCUMENTS

| | | |
|---|---|---|
| 3,914,722 A | 10/1975 | Mallonen |
| 8,649,132 B2 | 2/2014 | Yang |
| 2005/0001607 A1* | 1/2005 | Berland ............. G01R 31/3277 324/67 |
| 2009/0027146 A1* | 1/2009 | Mills ..................... H01H 71/40 335/35 |
| 2009/0190289 A1 | 7/2009 | Bellotto et al. |
| 2009/0284880 A1* | 11/2009 | Radosavljevic ....... H01H 71/20 361/45 |
| 2012/0099237 A1* | 4/2012 | Schroeder ................ H02H 1/06 361/115 |

(Continued)

OTHER PUBLICATIONS

International Search Report and Written Opinion for PCT/US2022/046651 Jan. 3, 2023.

(Continued)

*Primary Examiner* — Bryan R Perez
(74) *Attorney, Agent, or Firm* — Dawson Law Firm, P.C.; Michael J. Nickerson (57) ABSTRACT

A circuit breaker trip device includes a circuit interface configured to interface with a receptacle for providing electrical power; a trip mechanism, operatively connected to the circuit interface, configured to overload a circuit breaker associated with the receptacle providing electrical power when the trip mechanism is activated; a power indicator, operatively connected to the circuit interface and operatively connected in parallel with the trip mechanism, configured to communicate an operational status of the circuit breaker associated the receptacle for providing electrical power; and a safety circuit breaker, operatively connected to the circuit interface and operatively connected in series to the trip mechanism and the power indicator, configured to trip when the circuit breaker associated the receptacle for providing electrical power fails to trip upon activation of the trip mechanism.

26 Claims, 6 Drawing Sheets

(56) References Cited

U.S. PATENT DOCUMENTS

| | | | |
|---|---|---|---|
| 2012/0123762 A1* | 5/2012 | Studer, II | H02H 1/06 |
| | | | 361/93.6 |
| 2014/0043714 A1 | 2/2014 | Benke | |
| 2015/0062769 A1* | 3/2015 | Cortes Rico | H01H 83/02 |
| | | | 361/93.1 |
| 2015/0077243 A1 | 3/2015 | Hooper et al. | |
| 2016/0079024 A1 | 3/2016 | Nereau | |
| 2021/0234361 A1* | 7/2021 | Zhou | G01R 15/14 |

OTHER PUBLICATIONS

International Preliminary Report for PCT/US2022/046651 Apr. 2, 2024.

* cited by examiner

| POWER INDICATOR \ SAFETY BREAKER TRIP | YES | NO |
|---|---|---|
| YES | N/A | CIRCUIT UNDER TEST IS LIVE |
| NO | CIRCUIT UNDER TEST IS LIVE AND CIRCUIT BREAKER IS FAULTY | CIRCUIT UNDER TEST IS DEAD AND ACTUAL CIRCUIT BREAKER IS TRIPPED |

CIRCUIT BREAKER TRIP DEVICE

PRIORITY INFORMATION

The present application claims priority, under 35 USC § 119(e), from U.S. Provisional Patent Application Ser. No. 63/271,131, filed on Oct. 23, 2021. The entire content of U.S. Provisional Patent Application Ser. No. 63/271,131, filed on Oct. 23, 2021, is hereby incorporated by reference.

BACKGROUND

When doing electrical work on an existing circuit, it important that power to that circuit is turned OFF prior to commencing work on the existing circuit to avoid electrocution and/or other damage.

Conventionally, to turn OFF the existing circuit, one would go to the circuit panel (box) and manually put the circuit breaker, associated with the existing circuit, into an open state by manually moving a toggle switch.

However, one drawback to the conventional method is that the individual needs to know, a priori, the correct circuit breaker to manually put into an open state (no power); otherwise, the individual will be required to randomly put a circuit breaker into an open state and test the desired circuit for power to determine if the circuit breaker is associated with the desired circuit. This process must be repeated until the correct circuit breaker is found, thereby adding time to the project and also increasing the possibility of undesirably shutting off power to essential devices on non-desired circuits.

Moreover, the location of the circuit panel (box) may be remote (or some distance) from the desired circuit to be worked on, thereby making the conventional method more problematic due to the distance between the circuit panel (box) and the desired circuit to be worked on.

On the other hand, even if the individual knew, a priori, the correct circuit breaker to manually put into an open state, the individual should still test the desired circuit for power because the circuit breaker may still be in a closed state (power) even though the circuit breaker's toggle is in an open state position.

Therefore, it is desirable to provide a device that enables an individual to place the correct circuit breaker in an open state (no power) by directly interfacing with the desired circuit.

Moreover, it is desirable to provide a device that enables an individual to test the effectiveness of the circuit breaker associated with the desired circuit.

Additionally, it is desirable to provide a device that enables an individual to test the presence of power with respect to the desired circuit.

Furthermore, it is desirable to provide a device that enables an individual to place the correct circuit breaker in an open state (no power) by directly interfacing with the desired circuit and enables an individual to test the effectiveness of the circuit breaker associated with the desired circuit.

In addition, it is desirable to provide a device that enables an individual to place the correct circuit breaker in an open state (no power) by directly interfacing with the desired circuit and enables an individual to test the presence of power with respect to the desired circuit.

Lastly, it is desirable to provide a device that enables an individual to place the correct circuit breaker in an open state (no power) by directly interfacing with the desired circuit; enables an individual to test the effectiveness of the circuit breaker associated with the desired circuit; and enables an individual to test the presence of power with respect to the desired circuit.

BRIEF DESCRIPTION OF THE DRAWINGS

The drawings are only for purposes of illustrating various embodiments and are not to be construed as limiting, wherein.

DETAILED DESCRIPTION

For a general understanding, reference is made to the drawings. In the drawings, like references have been used throughout to designate identical or equivalent elements. It is also noted that the drawings may not have been drawn to scale and that certain regions may have been purposely drawn disproportionately so that the features and concepts may be properly illustrated.

Figure 1:
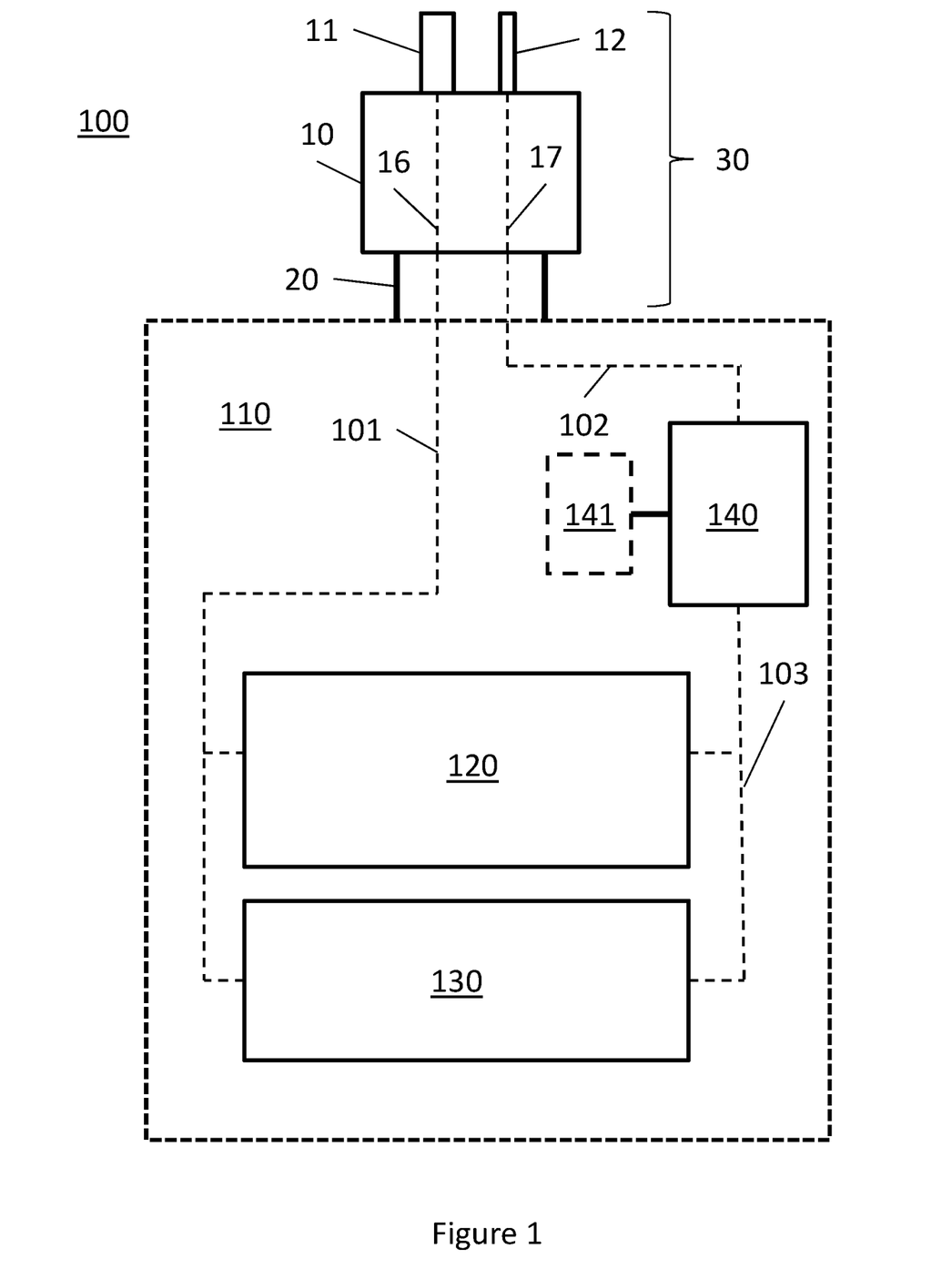
FIG. 1 illustrates a circuit breaker trip device.

FIG. 1 illustrates a circuit breaker trip device. As illustrated in FIG. 1, the circuit breaker trip device 100 includes an electrically insulated housing 110 to protect the user from electric shock and/or electrocution. The circuit breaker trip device 100 also includes a circuit interface 30.

As illustrated in FIG. 1, the circuit interface 30 is configured to interface with an electrical power receptacle or outlet (not shown). The circuit interface 30 includes a housing 10, a power blade 11, a neutral blade 12, and an electrical cord 20. The circuit interface 30 may also include a ground blade (not shown). Internal of the housing 10 and the electrical cord 20, the circuit interface 30 includes a power conduit 16 and a neutral conduit 17, electrically connected to the power blade 11 and neutral blade 12, respectively.

The electrical cord 20 is connected to the electrically insulated housing 110, wherein the power conduit 16 and the neutral conduit 17 are connected to a housing power conduit 101 and a housing neutral conduit 102, respectively, which are internal to the electrically insulated housing 110.

The housing power conduit 101 is electrically connected to a trip mechanism 120 and a power indicator 130, wherein the trip mechanism 120 and a power indicator 130 are connected in parallel. Moreover, a secondary housing neutral conduit 103 is electrically connected to the trip mechanism 120 and the power indicator 130.

In series with the trip mechanism 120 and a power indicator 130, a safety circuit breaker 140 is electrically connected, via the secondary housing neutral conduit 103 and the housing neutral conduit 102. The safety circuit breaker 140 is configured to trip (open state—no power) when the circuit breaker associated with the electrical power receptacle or outlet fails to trip.

The safety circuit breaker 140 may include an indicator 141 to indicate when the safety circuit breaker 140 has tripped (open state—no power).

If the safety circuit breaker 140 is tripped, the state of the circuit breaker associated with the electrical power receptacle or outlet is still closed, indicating that the circuit is live with power. Thus, the indicator 141 can communicate to the user that it is unsafe to work on the circuit when the indicator 141 communicates that the safety circuit breaker 140 has tripped.

Figure 2:
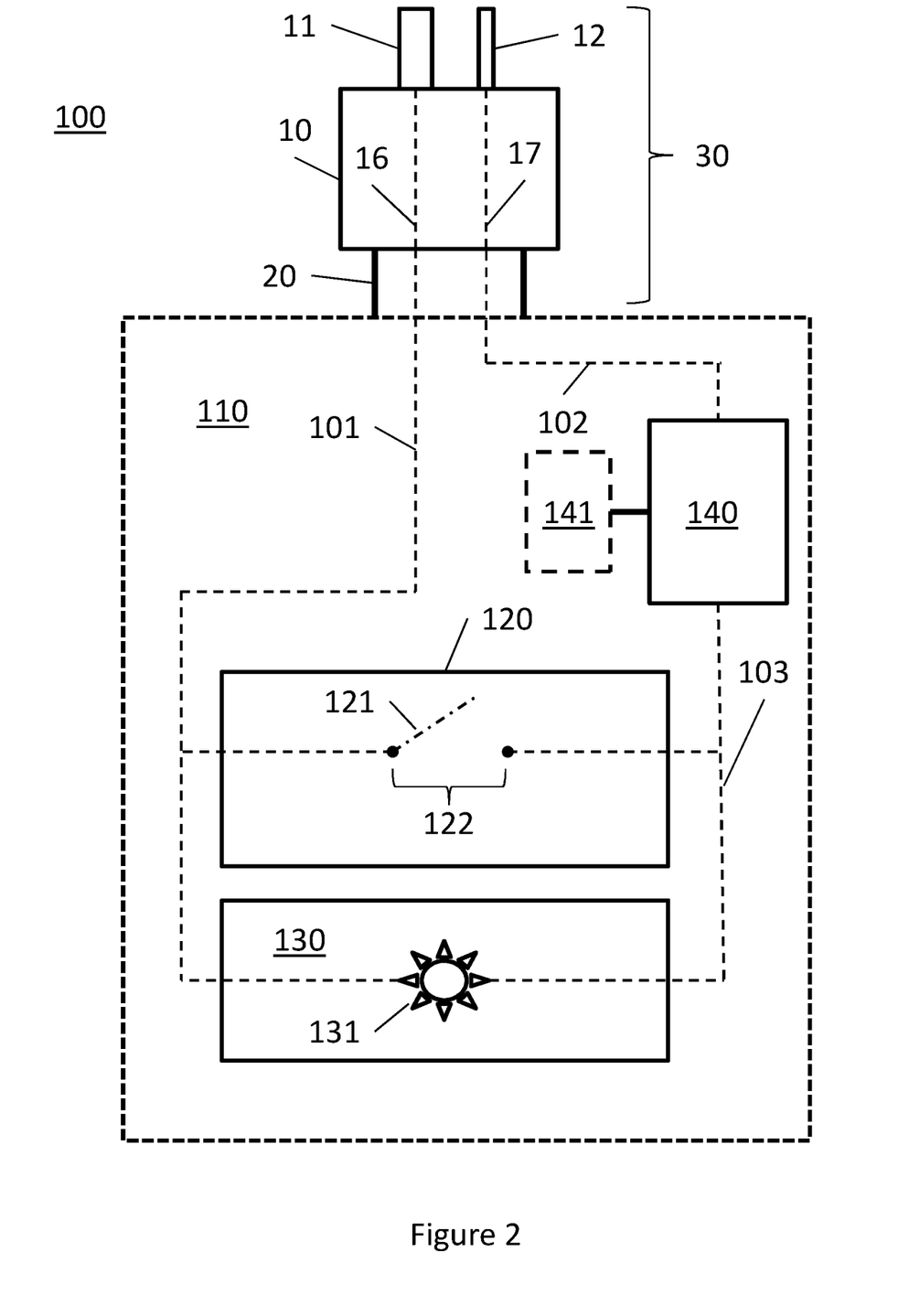
FIG. 2 illustrates a circuit breaker trip device of FIG. 1 in an open state.
Figure 3:
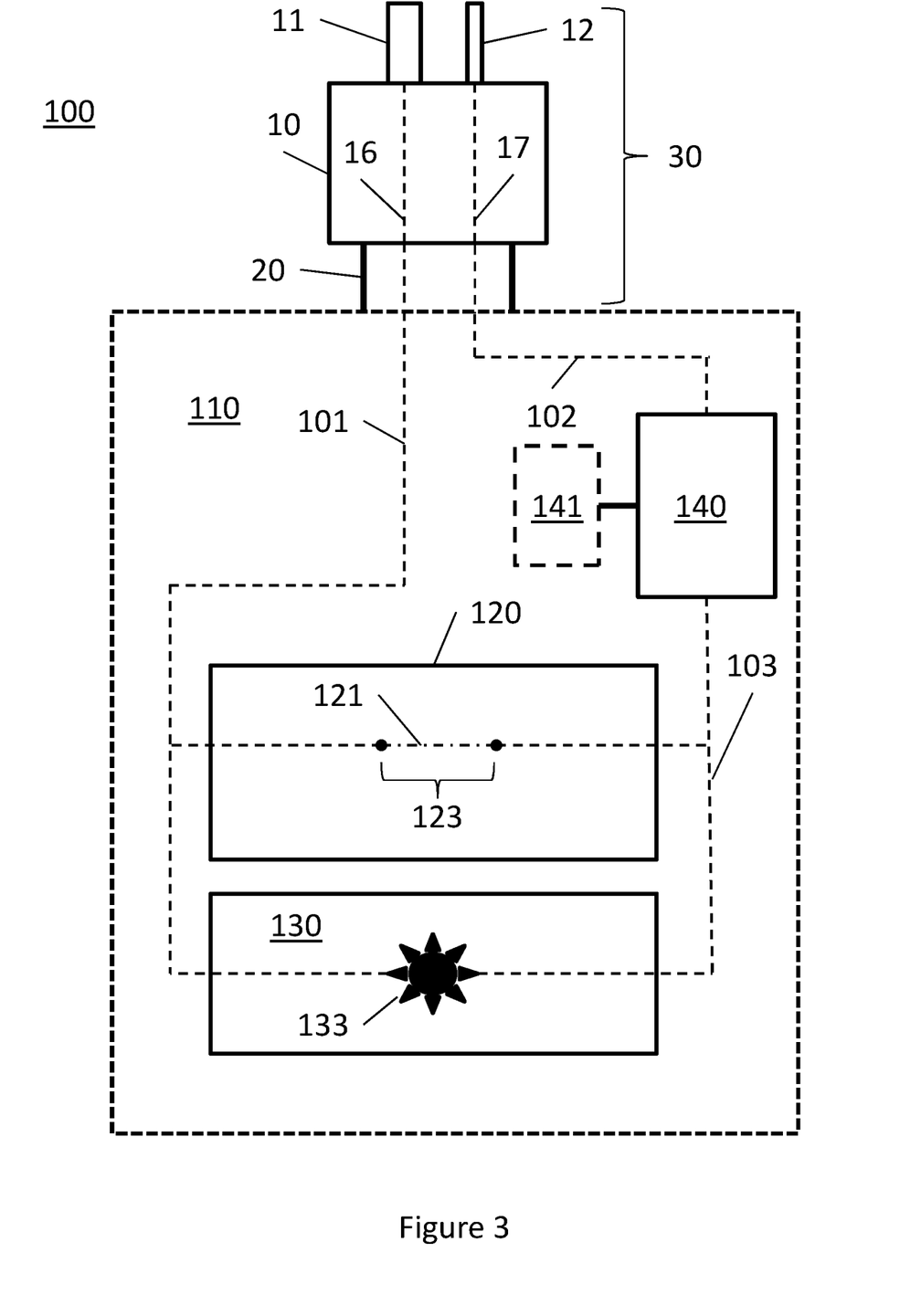
FIG. 3 illustrates the circuit breaker trip device of FIG. 1 in a closed state.

FIGS. 2 and 3 illustrate the operational states of the circuit breaker trip device 100. More specifically, FIG. 2 illustrates a circuit breaker trip device of FIG. 1 in an open state. As illustrated in FIG. 2, the circuit interface 30 is configured to interface with an electrical power receptacle or outlet (not shown). The circuit interface 30 includes a housing 10, a power blade 11, a neutral blade 12, and an electrical cord 20. The circuit interface 30 may also include a ground blade (not shown). Internal of the housing 10 and the electrical cord 20, the circuit interface 30 includes a power conduit 16 and a neutral conduit 17, electrically connected to the power blade 11 and neutral blade 12, respectively.

The electrical cord 20 is connected to the electrically insulated housing 110, wherein the power conduit 16 and the neutral conduit 17 are connected to a housing power conduit 101 and a housing neutral conduit 102, respectively, which are internal to the electrically insulated housing 110.

The housing power conduit 101 is electrically connected to a trip mechanism 120 and a power indicator 130, wherein the trip mechanism 120 and a power indicator 130 are connected in parallel. Moreover, a secondary housing neutral conduit 103 is electrically connected to the trip mechanism 120 and the power indicator 130.

As illustrated in FIG. 2, the trip mechanism 120 includes a switch 121 in an open state 122. When the switch 121 is in the open state and the circuit interface 30 is connected to an electrical power receptacle or outlet (not shown), power does not flow through the trip mechanism 120. However, when the switch 121 is in the open state and the circuit interface 30 is connected to an electrical power receptacle or outlet (not shown), power does flow through power indicator 130, which, as illustrated, may include a light 131 that illuminates when power does flow through power indicator 130 to indicate a live circuit or the presence of live power.

In series with the trip mechanism 120 and a power indicator 130, a safety circuit breaker 140 is electrically connected, via the secondary housing neutral conduit 103 and the housing neutral conduit 102. The safety circuit breaker 140 is configured to trip (open state—no power) when the circuit breaker associated with the electrical power receptacle or outlet fails to trip.

The safety circuit breaker 140 may include an indicator 141 to indicate when the safety circuit breaker 140 has tripped (open state—no power).

If the safety circuit breaker 140 is tripped, the state of the circuit breaker associated with the electrical power receptacle or outlet is still closed, indicating that the circuit is live with power. Thus, the indicator 141 can communicate to the user that it is unsafe to work on the circuit when the indicator 141 communicates that the safety circuit breaker 140 has tripped.

FIG. 3 illustrates the circuit breaker trip device of FIG. 1 in a closed state. As illustrated in FIG. 3, the circuit interface 30 is configured to interface with an electrical power receptacle or outlet (not shown). The circuit interface 30 includes a housing 10, a power blade 11, a neutral blade 12, and an electrical cord 20. The circuit interface 30 may also include a ground blade (not shown). Internal of the housing 10 and the electrical cord 20, the circuit interface 30 includes a power conduit 16 and a neutral conduit 17, electrically connected to the power blade 11 and neutral blade 12, respectively.

The electrical cord 20 is connected to the electrically insulated housing 110, wherein the power conduit 16 and the neutral conduit 17 are connected to a housing power conduit 101 and a housing neutral conduit 102, respectively, which are internal to the electrically insulated housing 110.

The housing power conduit 101 is electrically connected to a trip mechanism 120 and a power indicator 130, wherein the trip mechanism 120 and a power indicator 130 are connected in parallel. Moreover, a secondary housing neutral conduit 103 is electrically connected to the trip mechanism 120 and the power indicator 130.

As illustrated in FIG. 3, the trip mechanism 120 includes a switch 121 in a closed state 123. When the switch 121 is in the closed state and the circuit interface 30 is connected to an electrical power receptacle or outlet (not shown), power flows through the trip mechanism 120. However, since the switch 121 is in the closed state, the switch 121 causes a short circuit in the circuit breaker trip device 100, which will cause the circuit breaker, associated with the electrical power receptacle or outlet (not shown), located in the circuit panel (box) to trip (open state—no power).

Upon the tripping of the circuit breaker, associated with the electrical power receptacle or outlet (not shown), located in the circuit panel (box), light 133, in power indicator 130, is not illuminated, indicating a dead circuit or no presence of live power.

In series with the trip mechanism 120 and a power indicator 130, a safety circuit breaker 140 is electrically connected, via the secondary housing neutral conduit 103 and the housing neutral conduit 102. The safety circuit breaker 140 is configured to trip (open state—no power) when the circuit breaker associated with the electrical power receptacle or outlet fails to trip upon the closing of switch 121.

The amperage associated with the safety circuit breaker 140 is higher that the amperage rating of the circuit breaker being tested so as not to trip prematurely, thereby allowing the circuit breaker to trip before the safety circuit breaker 140 trips. For example, the safety circuit breaker 140 may be configured to trip at a thirty amp load when testing a circuit breaker configured to trip at a fifteen amp load. The safety circuit breaker 140 should be configured to trip at an amp load that is higher than the amp load rating for the circuit breaker.

It is noted that the safety circuit breaker 140 may include various settings, allowing the user to set the safety circuit breaker 140 at a specific amp load that is greater than the circuit breaker being tested. The user may interact with a dial or other type of interface (not shown) associated with the safety circuit breaker 140 to set the desired amp load of the safety circuit breaker 140.

It is noted that if the circuit breaker associated with the electrical power receptacle or outlet fails to trip upon the closing of switch 121 and the safety circuit breaker 140 is tripped, the user knows that the circuit breaker associated with the electrical power receptacle or outlet is faulty or non-operational and must be replaced.

The safety circuit breaker 140 may include an indicator 141 to indicate when the safety circuit breaker 140 has tripped (open state—no power).

If the safety circuit breaker 140 is tripped, the state of the circuit breaker associated with the electrical power receptacle or outlet is still closed, indicating that the circuit is live with power. Thus, the indicator 141 can communicate to the user that it is unsafe to work on the circuit when the indicator 141 communicates that the safety circuit breaker 140 has tripped.

Figure 4:
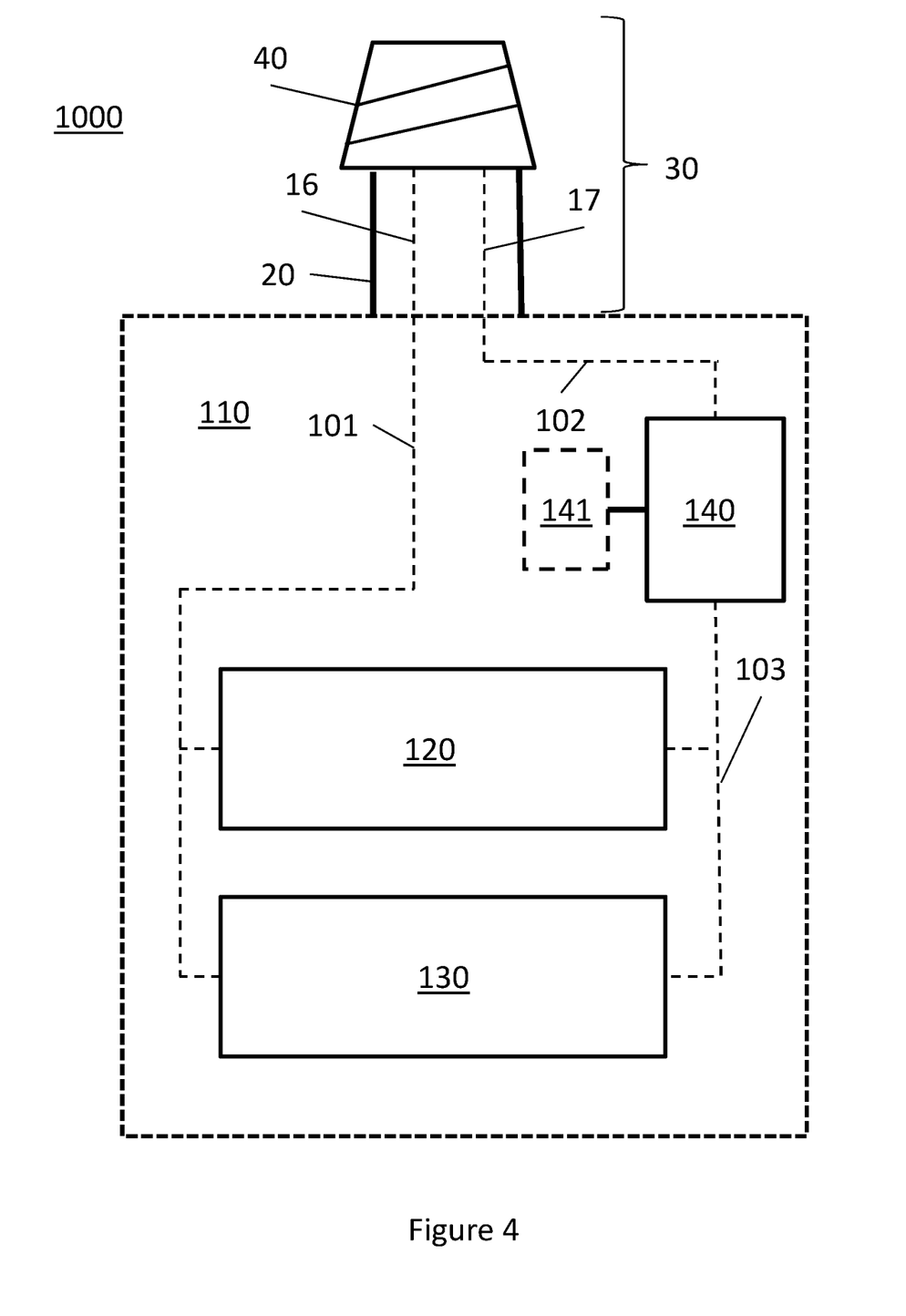
FIG. 4 illustrates another embodiment of a circuit breaker trip device.

FIG. 4 illustrates another embodiment of a circuit breaker trip device. As illustrated in FIG. 4, the circuit breaker trip device 100 includes an electrically insulated housing 110 to protect the user from electric shock and/or electrocution. The circuit breaker trip device 100 also includes a circuit interface 30.

As illustrated in FIG. 4, the circuit interface 30 is configured to interface with a light bulb receptacle or outlet (not shown). The circuit interface 30 includes a housing 40 configured to interface with a light bulb receptacle or outlet (not shown) and an electrical cord 20. Internal of the electrical cord 20, the circuit interface 30 includes a power conduit 16 and a neutral conduit 17, electrically connected to the housing 40.

The electrical cord 20 is connected to the electrically insulated housing 110, wherein the power conduit 16 and the neutral conduit 17 are connected to a housing power conduit 101 and a housing neutral conduit 102, respectively, which are internal to the electrically insulated housing 110.

The housing power conduit 101 is electrically connected to a trip mechanism 120 and a power indicator 130, wherein the trip mechanism 120 and a power indicator 130 are connected in parallel. Moreover, a secondary housing neutral conduit 103 is electrically connected to the trip mechanism 120 and the power indicator 130.

In series with the trip mechanism 120 and a power indicator 130, a safety circuit breaker 140 is electrically connected, via the secondary housing neutral conduit 103 and the housing neutral conduit 102. The safety circuit breaker 140 is configured to trip (open state—no power) when the circuit breaker associated with the electrical power receptacle or outlet fails to trip.

The safety circuit breaker 140 may include an indicator 141 to indicate when the safety circuit breaker 140 has tripped (open state—no power).

If the safety circuit breaker 140 is tripped, the state of the circuit breaker associated with the electrical power receptacle or outlet is still closed, indicating that the circuit is live with power. Thus, the indicator 141 can communicate to the user that it is unsafe to work on the circuit when the indicator 141 communicates that the safety circuit breaker 140 has tripped.

Figure 5:
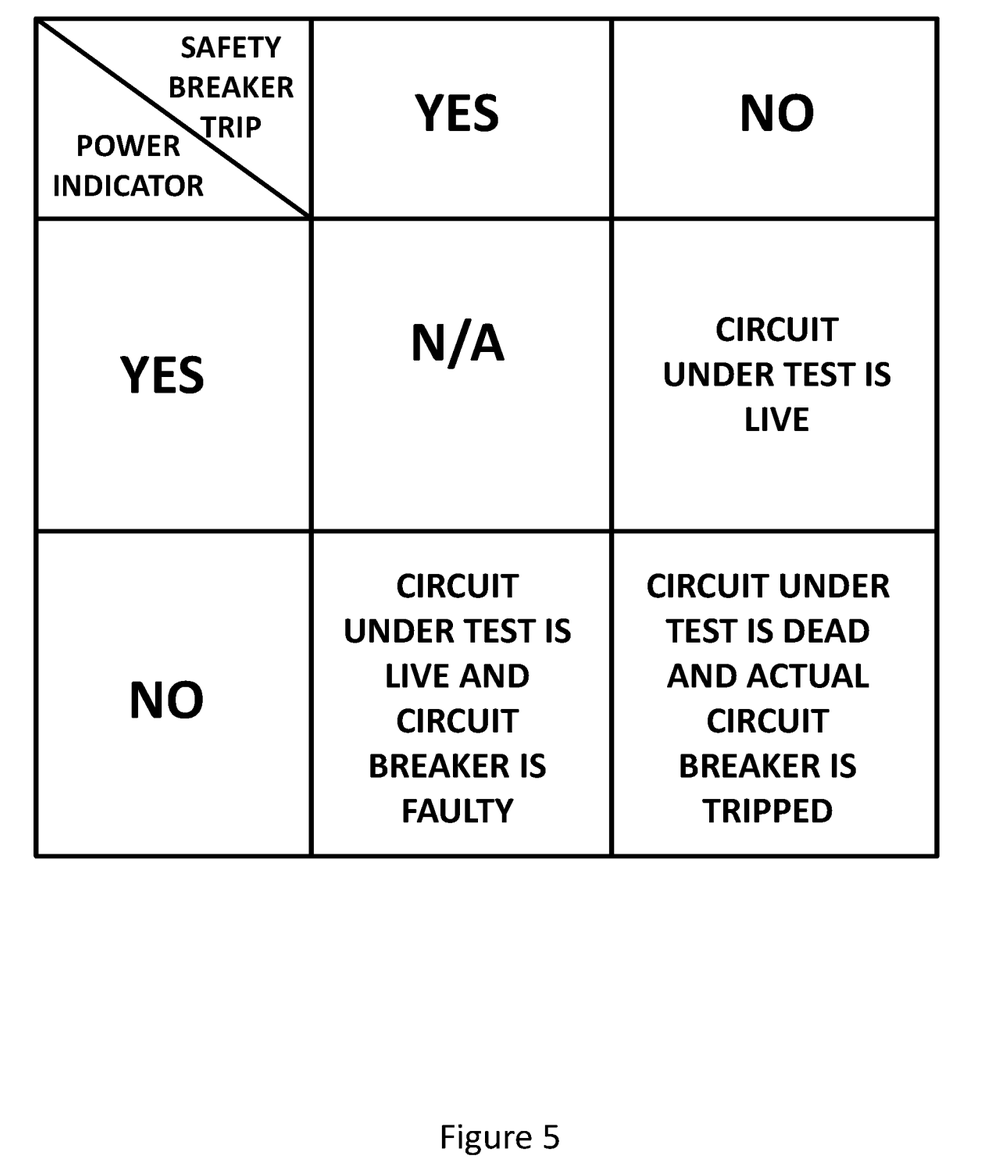
FIG. 5 is a table illustrating the state of the circuit under test and the state of the circuit breaker associated with the circuit under test.

FIG. 5 is a table illustrating the state of the circuit under test and the state of the circuit breaker associated with the circuit under test. As illustrated in FIG. 5, the rows of the table correspond to the state of the power indicator; i.e., whether the circuit under test is live, with power, or dead, without power. If the table shows that the power indicator is "YES," the circuit under test is live, with power; i.e., power is flowing through the power indicator of the circuit breaker trip device. If the table shows that the power indicator is "NO," the circuit under test is dead, without power; i.e., no power is flowing through the power indicator of the circuit breaker trip device.

Moreover, as illustrated in FIG. 5, the columns of the table correspond to the state of the safety circuit breaker; i.e., whether the safety circuit breaker has been tripped or not. If the table shows that the safety breaker trip is "YES," the safety circuit breaker has been tripped; i.e., the actual circuit breaker associated with the circuit under test did not trip and may be malfunctioning. If the table shows that the safety breaker trip is "NO," the safety circuit breaker has not been tripped; i.e., the actual circuit breaker of the circuit under test may have been tripped and is functioning properly.

As illustrated in the table of FIG. 5, if the power indicator is "NO" and the safety breaker trip is "YES," the circuit breaker trip device is indicating to the user that the circuit under test is live with power and the actual circuit breaker associated with the circuit under test did not trip and is probably malfunctioning. Additionally, as shown in the table of FIG. 5, if the power indicator is "YES" and the safety breaker trip is "NO," the circuit under test is live. Lastly, as shown in the table of FIG. 5, if the power indicator is "NO" and the safety breaker trip is "NO," the circuit under test is dead and the actual circuit breaker associated with the circuit under test has been tripped or is in an open state.

In operation, the circuit breaker trip device is connected to the circuit under test. If the power for the circuit under test is live, the power indicator will indicate live power. If the power for the circuit under test is dead, the power indicator will indicate a dead circuit.

If the circuit under test is live, the user can activate the trip mechanism to create a short circuit in the circuit under test. If the actual circuit breaker associated with the circuit under test is functioning properly, the short circuit will cause the actual circuit breaker associated with the circuit under test to trip and the power indicator will indicate a dead circuit.

However, if the actual circuit breaker associated with the circuit under test is not functioning properly and does not trip, the safety circuit breaker will trip indicating to the user that the actual circuit breaker associated with the circuit under test is not functioning properly and the circuit under test is still live with power.

Figure 6:
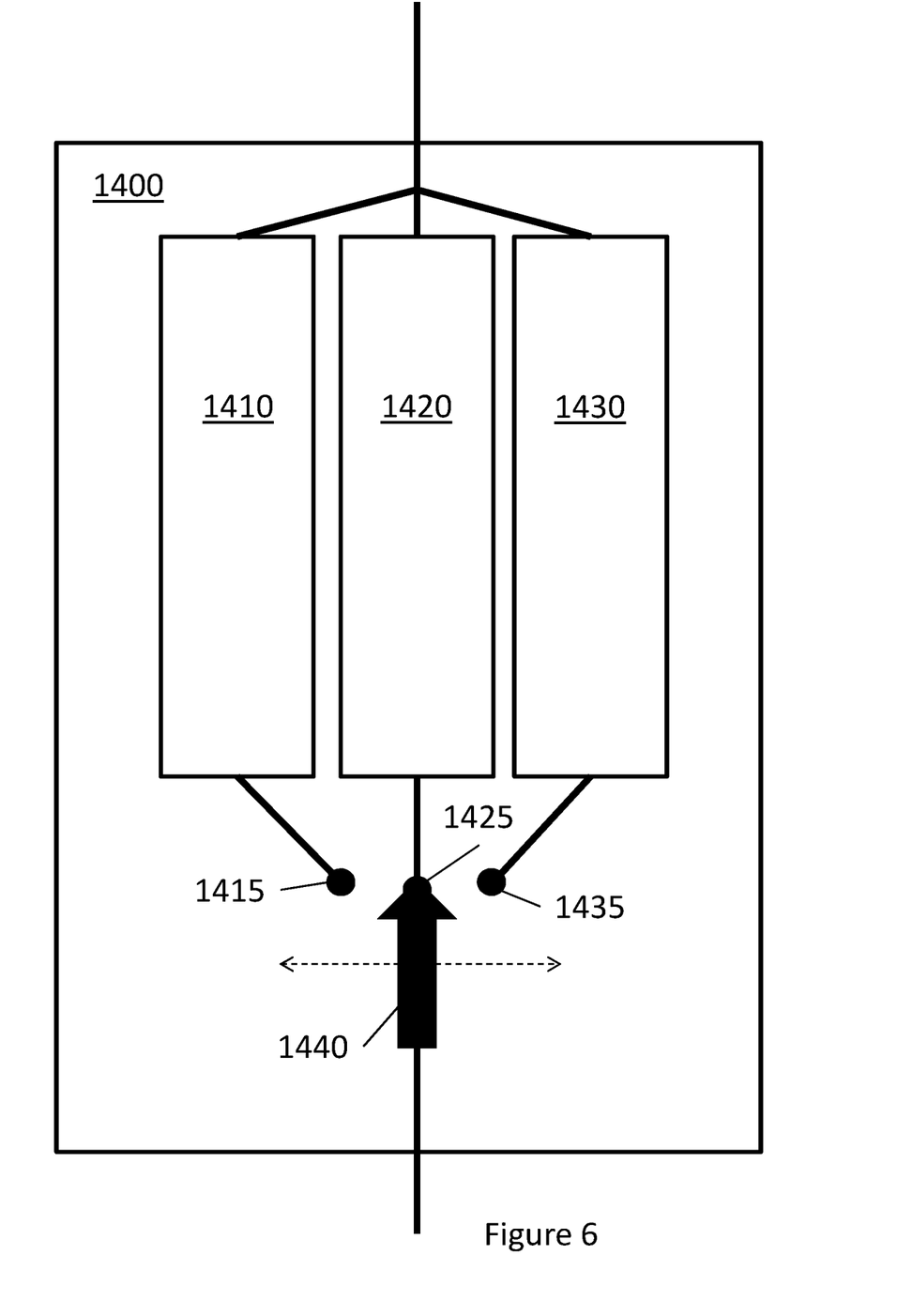
FIG. 6 illustrates a safety circuit breaker having multiple settings.

FIG. 6 illustrates a safety circuit breaker having multiple settings. As illustrated in FIG. 6, a safety circuit breaker 1400 includes multiple circuit breakers 1410, 1420, and 1430. Each circuit breaker having a different load rating. For example, circuit breaker 1410 may have a load rating of 20 amps for testing circuits having ratings below 15 amps; circuit breaker 1420 may have a load rating of 30 amps for testing circuits having ratings below 20 amps; and circuit breaker 1430 may have a load rating of 40 amps for testing circuits having ratings below 30 amps.

It is noted that the circuit breakers load ratings may vary to provide a larger range of testing options.

It is also noted that the safety circuit breaker 1400 may have a receptacle (not shown) for accepting a circuit breaker so that the user can insert the circuit breaker with the desired load rating into the receptacle to be utilized by the safety circuit breaker 1400.

The safety circuit breaker 1400 further includes a switch 1440 to enable the user to select between the multiple circuit breakers 1410, 1420, and 1430 by moving the switch 1440 between contact points 1415, 1425, and 1435.

It is noted that the switch 1440 may have information thereon to inform the user as to the load rating of the selected safety circuit breaker so that the user can select the appropriate breaker.

The above described circuit breaker trip device enables a user to remotely trip a circuit breaker by interfacing with the desired circuit and causing a load or short circuit so as to safely and effectively trip the circuit breaker associated with the desired circuit.

In addition, the above described circuit breaker trip device enables a user to remotely test a circuit breaker because if the safety circuit breaker within the circuit breaker trip device is trip when trying to remotely trip a circuit breaker, the user knows that the circuit breaker is faulty or non-operational and that the circuit is live with power and unsafe to work on.

Lastly, the above described circuit breaker trip device enables a user to test for the presence of power upon interfacing with the circuit.

It is noted that although the trip mechanism of the circuit breaker trip device has been described as having a switch to create a short circuit to overload the circuit and trip the circuit breaker, the switch can be replaced with a switchable electrical load having a load capacity large enough to overload the circuit and trip the circuit breaker.

It is also noted that the trip mechanism of the circuit breaker trip device can be configured to be a plug and play module making it easier to replace if it becomes damaged from repeated use.

It is further noted that the power indicator of the circuit breaker trip device can be configured to be a plug and play module making it easier to replace if it becomes damaged from repeated use.

It is additionally noted that although the circuit interface of the circuit breaker trip device has been described as being configured to interface with an electrical outlet or a lightbulb receptacle, the circuit interface of the circuit breaker trip device may be alligator clips or configured in any number of ways to provide and electrical interface with a power source to be tested.

Although the various embodiments of the circuit breaker trip device have been described with an electrical cord, an electrical cord is not necessarily need. Any device, which provides an electrical interface between the circuit breaker trip device and the power source (circuit breaker) being tested, is appropriate.

Moreover, although the various embodiments of the circuit breaker trip device have been described with a safety circuit breaker, the safety circuit breaker is optional. The safety circuit breaker merely provides an additional safety feature for the circuit breaker trip device.

The circuit breaker trip device comprises an electrical circuit interface, an electrically insulated housing, a circuit breaker tripping mechanism, and a power indicator.

The circuit breaker trip device may include an electrical cord to electrically connect the electrical circuit interface with the circuit breaker tripping mechanism.

Moreover, the circuit breaker trip device may include a safety circuit breaker which trips if the desired circuit breaker fails to trip.

The circuit breaker trip device may include a safety circuit breaker which trips if the desired circuit breaker fails to trip and a safety circuit breaker indicator, which indicates that the safety circuit breaker indicator has been tripped.

The circuit breaker tripping mechanism may be a switch which creates a short circuit.

Also, the circuit breaker tripping mechanism may be a switchable load large enough to trip the desired circuit breaker.

The power indicator may be: an optical device, such as a light, a light bulb, a LED, or a LCD; a mechanical device; or an audio device.

A circuit breaker trip device comprises a circuit interface configured to interface with a receptacle for providing electrical power; a trip mechanism, operatively connected to the circuit interface, configured to overload a circuit breaker associated with the receptacle providing electrical power when the trip mechanism is activated; a power indicator, operatively connected to the circuit interface and operatively connected in parallel with the trip mechanism, configured to communicate a power status of the circuit associated with the receptacle providing electrical power; and a safety circuit breaker, operatively connected to the circuit interface and operatively connected in series to the trip mechanism and the power indicator, configured to trip when the circuit breaker associated with the receptacle providing electrical power fails to trip upon activation of the trip mechanism.

The trip mechanism may include a switch configured to create, when the trip mechanism is activated, a short circuit to overload the circuit breaker associated with the receptacle providing electrical power.

The trip mechanism may include a switchable electrical load configured to have a load capacity to overload, when the trip mechanism is activated, the circuit breaker associated with the receptacle providing electrical power.

The circuit interface may be configured to electrically interface with an electrical receptacle.

The circuit interface may be configured to electrically interface with an electrical outlet.

The circuit interface may be configured to electrically interface with a light bulb receptacle.

The circuit breaker trip device may further comprise a safety circuit breaker indicator, operatively connected to the safety circuit breaker, configured to indicate the safety circuit breaker has been tripped.

The circuit breaker trip device may further comprise a safety circuit breaker indicator, operatively connected to the safety circuit breaker, configured to indicate that a circuit associated with the receptacle providing electrical power has power.

The circuit breaker trip device may further comprise a safety circuit breaker indicator, operatively connected to the safety circuit breaker, configured to indicate that a circuit breaker associated with the receptacle providing electrical power did not trip when the trip mechanism has been activated.

The circuit breaker trip device may further comprise an electrically insulated housing; the electrically insulated housing configured to house the trip mechanism, the power indicator, and the safety circuit breaker.

The circuit breaker trip device may further comprise a power cord, operatively connected to the electrically insulated housing and the circuit interface, configured to electrically connect the circuit interface to the trip mechanism and the power indicator.

The power indicator may be a light. The power indicator may be an audio device. The safety circuit breaker indicator may be a light. The safety circuit breaker indicator may be an audio device.

The safety circuit breaker may include multiple selectable safety circuit breakers, each selectable safety circuit breaker having a different amperage load rating.

The safety circuit breaker may be configured to be replaceable with a safety circuit breaker having a different amperage load rating.

The power indicator may be configured to communicate an operational status of the circuit breaker associated with the receptacle providing electrical power.

It will be appreciated that variations of the above-disclosed embodiments and other features and functions, and/or alternatives thereof, may be desirably combined into many other different systems and/or applications. Also, various presently unforeseen and/or unanticipated alternatives, modifications, variations, and/or improvements therein may be subsequently made by those skilled in the art which are also intended to be encompassed by the description above and the following claims.

What is claimed is:

1. A circuit breaker trip device comprising:
   a housing; and a circuit interface;

said housing including a user activatable switch;

said circuit interface being operatively connected to said user activatable switch;

said circuit interface being configured to interface with a circuit breaker protected power source, the circuit breaker protected power source including a circuit breaker;

said user activatable switch being configured, in response to a user activating said user activatable switch, to overload the circuit breaker protected power source and trip the circuit breaker associated with the circuit breaker protected power source;

said user activatable switch including a switchable electrical load, said switchable electrical load being configured to have a load capacity, in response to the user activating said user activatable switch, to overload the circuit breaker protected power source and trip the circuit breaker associated with the circuit breaker protected power source.

2. The circuit breaker trip device, as claimed in claim 1, wherein said housing includes a safety circuit breaker, operatively connected to said user activatable switch, configured to trip when the circuit breaker associated with the circuit breaker protected power source fails to trip in response to the user activating said user activatable switch creating an overload.

3. The circuit breaker trip device, as claimed in claim 2, wherein said housing includes a safety circuit breaker indicator, operatively connected to said safety circuit breaker, configured to indicate said safety circuit breaker has been tripped.

4. The circuit breaker trip device, as claimed in claim 3, wherein said safety circuit breaker indicator is a light.

5. The circuit breaker trip device, as claimed in claim 3, wherein said safety circuit breaker indicator is an audio device.

6. The circuit breaker trip device, as claimed in claim 2, wherein said safety circuit breaker is configured to be replaceable with a safety circuit breaker having a different amperage load rating.

7. The circuit breaker trip device, as claimed in claim 2, wherein said safety circuit breaker includes multiple selectable safety circuit breakers, each selectable safety circuit breaker having a different amperage load rating.

8. The circuit breaker trip device, as claimed in claim 1, wherein said housing includes a power indicator, operatively connected in parallel with said user activatable switch, configured to communicate a power status of the circuit breaker protected power source.

9. The circuit breaker trip device, as claimed in claim 8, wherein said power indicator is configured to communicate an operational status of the circuit breaker associated with the circuit breaker protected power source.

10. The circuit breaker trip device, as claimed in claim 8, wherein said power indicator is a light.

11. The circuit breaker trip device, as claimed in claim 8, wherein said power indicator is an audio device.

12. The circuit breaker trip device, as claimed in claim 1, wherein said circuit interface is integral to said housing.

13. A circuit breaker trip device comprising:

a housing; and a circuit interface;

said housing including a user activatable switch;

said circuit interface being operatively connected to said user activatable switch;

said circuit interface being configured to interface with a circuit breaker protected power source, the circuit breaker protected power source including a circuit breaker;

said user activatable switch being configured, in response to a user activating said user activatable switch, to overload the circuit breaker protected power source and trip the circuit breaker associated with the circuit breaker protected power source;

said user activatable switch including a switchable short circuit, said switchable short circuit being configured, in response to the user activating said user activatable switch, to create a short circuit and overload the circuit breaker protected power source and trip the circuit breaker associated with the circuit breaker protected power source.

14. The circuit breaker trip device, as claimed in claim 13, wherein said housing includes a safety circuit breaker, operatively connected to said user activatable switch, configured to trip when the circuit breaker associated with the circuit breaker protected power source fails to trip in response to the user activating said user activatable switch creating an overload.

15. The circuit breaker trip device, as claimed in claim 14, wherein said housing includes a safety circuit breaker indicator, operatively connected to said safety circuit breaker, configured to indicate said safety circuit breaker has been tripped.

16. The circuit breaker trip device, as claimed in claim 15, wherein said safety circuit breaker indicator is a light.

17. The circuit breaker trip device, as claimed in claim 15, wherein said safety circuit breaker indicator is an audio device.

18. The circuit breaker trip device, as claimed in claim 14, wherein said safety circuit breaker includes multiple selectable safety circuit breakers, each selectable safety circuit breaker having a different amperage load rating.

19. The circuit breaker trip device, as claimed in claim 14, wherein said safety circuit breaker is configured to be replaceable with a safety circuit breaker having a different amperage load rating.

20. The circuit breaker trip device, as claimed in claim 13, wherein said housing includes a power indicator, operatively connected in parallel with said user activatable switch, configured to communicate a power status of the circuit breaker protected power source.

21. The circuit breaker trip device, as claimed in claim 20, wherein said power indicator is a light.

22. The circuit breaker trip device, as claimed in claim 20, wherein said power indicator is an audio device.

23. A circuit breaker trip device comprising:

a user activatable trip mechanism including a user activatable switch;

said user activatable trip mechanism being configured to operatively connect to a circuit breaker protected power source;

said user activatable trip mechanism being configured, in response to a user activating said user activatable switch, to trip a circuit breaker associated with the circuit breaker protected power source;

a safety circuit breaker, operatively connected to said user activatable trip mechanism, configured to trip when the circuit breaker associated with the circuit breaker protected power source fails to trip in response to the user activating said user activatable switch; and a safety circuit breaker indicator, operatively connected to said safety circuit breaker, configured to indicate that the circuit breaker associated with the circuit breaker protected power source did not trip in response to the user activating said user activatable switch.

24. The circuit breaker trip device, as claimed in claim 23, wherein said safety circuit breaker indicator is a light.

25. The circuit breaker trip device, as claimed in claim 23, wherein said safety circuit breaker indicator is an audio device.

26. A circuit breaker trip device comprising:
a user activatable trip mechanism including a user activatable switch;
said user activatable trip mechanism being configured to operatively connect to a circuit breaker protected power source;
said user activatable trip mechanism being configured, in response to a user activating said user activatable switch, to trip a circuit breaker associated with the circuit breaker protected power source;
a power indicator, operatively connected in parallel with said user activatable trip mechanism, configured to communicate a power status of the circuit breaker protected power source; and
a safety circuit breaker, operatively connected in series with said user activatable trip mechanism and said power indicator, configured to trip when the circuit breaker associated with the circuit breaker protected power source fails to trip in response to the user activating said user activatable switch.

* * * * *